United States Patent
Gardner et al.

[11] Patent Number: 6,140,688
[45] Date of Patent: Oct. 31, 2000

[54] SEMICONDUCTOR DEVICE WITH SELF-ALIGNED METAL-CONTAINING GATE

[75] Inventors: Mark I. Gardner, Cedar Creek, Tex.; Sey-Ping Sun, Austin, Tex.

[73] Assignee: Advanced Micro Devices Inc., Sunnyvale, Calif.

[21] Appl. No.: 09/157,627

[22] Filed: Sep. 21, 1998

[51] Int. Cl.$^7$ ................................... H01L 29/76
[52] U.S. Cl. ................ 257/412; 257/316; 257/487; 257/412; 257/413
[58] Field of Search ................ 257/407, 412, 257/413, 316

[56] References Cited

U.S. PATENT DOCUMENTS

| | | | |
|---|---|---|---|
| 3,936,860 | 2/1976 | Hill | 357/23 |
| 5,616,948 | 4/1997 | Pfiester | 257/412 |
| 5,744,845 | 4/1998 | Saayama et al. | 257/371 |
| 5,780,891 | 7/1998 | Kauffman et al. | 257/316 |
| 5,783,850 | 7/1998 | Liuau et al. | 257/355 |
| 5,828,130 | 10/1998 | Miller et al. | 257/754 |
| 5,894,160 | 4/1999 | Chan et al. | 257/412 |
| 5,932,919 | 8/1999 | Schwalke | 257/369 |
| 5,932,920 | 8/1999 | Kim et al. | 257/395 |
| 5,940,698 | 8/1999 | Gardner et al. | 438/197 |
| 5,952,701 | 9/1999 | Bulucea et al. | 257/740 |
| 5,962,904 | 10/1999 | Hu | 257/412 |

FOREIGN PATENT DOCUMENTS

| | | | |
|---|---|---|---|
| 356019671 | 2/1981 | Japan | 257/412 |
| 405102467 | 2/1981 | Japan | 257/412 |

*Primary Examiner*—Sheila V. Clark
*Assistant Examiner*—Edgardo Ortiz
*Attorney, Agent, or Firm*—Kevin L. Daffer; Conley, Rose & Tayon

[57] ABSTRACT

A semiconductor device is provided and formed using self-aligned metal-containing gates within a metal-oxide semiconductor (MOS) process. After forming junction regions within a semiconductor substrate, the gate conductor, or junction implant alignment structure, is at least partially removed to form a trench within a dielectric formed above the substrate. Upper surfaces of the transistor, except the upper surface of the gate conductor, are thereby protected by the dielectric. A metal-containing material can then be arranged within the trench, i.e., in the region removed of the gate conductor. The metal material can be formed either as a single layer or as multiple metal and/or dielectric layers interposed throughout the as-filled trench. The metal-filled trench formation occurs after high temperature cycles often associated with activating the previously implanted junctions or growing gate dielectrics. Thus, low-temperature metals such as copper or copper alloys can be used.

20 Claims, 9 Drawing Sheets

SEMICONDUCTOR DEVICE WITH SELF-ALIGNED METAL-CONTAINING GATE

BACKGROUND OF THE INVENTION

1. Field of the Invention

This invention relates to integrated circuit fabrication, and more particularly, to a semiconductor device having a self-aligned metal-containing gate structure and to a method for producing this device.

2. Description of the Relevant Art

The formation of self-aligned source and drain regions is a well-established technique in MOSFET fabrication. These source and drain regions exhibit minimal overlap with the transistor gate, minimizing the parasitic capacitances that limit high-frequency transistor performance. In general, the self-alignment is achieved by fabricating a gate conductor, and subsequently using the gate conductor as a mask for implantation of dopant impurities to form the source and drain. Because it is formed before the implantation and subsequent annealing of the source and drain impurities, the gate conductor must be made from a material which can withstand high-temperature processing.

The current material of choice for gate conductors in MOSFET fabrication is polycrystalline silicon, or polysilicon. Although polysilicon has good high-temperature properties, it has high resistivity compared to that of a metal. The resistance R of a material region can be defined in terms of the material's resistivity, p, the region's cross-sectional area, A, and the region's length, l, using the equation $R=pl/A$. As features on integrated circuits become smaller, area A decreases, and it becomes more and more important for resistivity to be low in order to achieve low resistances. The resistivity of a polysilicon gate conductor is typically lowered by doping. The doping is often performed by ion implantation, using the same implants which dope the self-aligned source and drain. Problems arise with this process, however, because typical gate conductor thicknesses are greater than the depths of the shallow junctions required for source and drain regions in high-performance devices. In order to achieve relatively shallow junctions, the lower portion of the polysilicon gate conductor receives fewer dopants than the upper portion. The region of the gate conductor adjacent to the gate dielectric therefore has a higher resistivity, and the resulting device performs as if it had an increased gate dielectric thickness. If the implantation depth is increased to more completely dope the gate conductor profile, however, the source and drain regions may extend too far into the substrate.

A gate conductor made from a low-resistance metal would alleviate many of the problems with polysilicon gate conductors discussed above. Unfortunately, low-resistance metals such as aluminum are not able to withstand the high-temperature processing needed, for example, to anneal the as-implanted source and drain regions employed within a standard self-aligned process. It would therefore be desirable to develop a method of forming self-aligned gates using low-resistance metals or metal alloys.

SUMMARY OF THE INVENTION

The problems outlined above are in large part addressed by employing a process in which a metal-containing self-aligned gate structure is formed after high-temperature processes such as the source and drain anneal cycles. One or more polysilicon-gate transistors which may include dielectric sidewall spacers are fabricated on a semiconductor substrate. Self-aligned source and drain impurity introduction may be included in this fabrication, and a salicide process may be performed on the transistors. Dielectric regions, or interlevel dielectrics, are subsequently formed over the substrate and surrounding the transistor gate conductors such that upper surfaces of the dielectric regions are even with upper surfaces of the transistor gate conductors. In this way, all upper surfaces of the transistors except the upper surfaces of the gate conductors are protected by dielectric. One or more of the transistor gate conductors may be covered by a masking layer, so that subsequent processing to form metal-containing gate structures affects only uncovered gate conductors. A portion of each uncovered polysilicon gate conductor is subsequently removed by a self-aligned, selective etch process to produce a trench within the previously formed polysilicon gate. A base of the trench comprises an upper surface of the remaining gate conductor. Depending on the desired operating characteristics of the finalized device, this trench may subsequently be refilled with materials including low-resistivity metals, dielectric layers, and/or polysilicon layers. Any material deposited external to the trench is subsequently removed, preferably using chemical-mechanical polishing, as in a damascene process.

The dielectric regions or sidewall spacers formed adjacent to the original polysilicon gate conductor may serve to define the dimensions of the new gate structure formed after a portion of the polysilicon is removed. In this manner, although the new gate structure is formed after the source and drain regions of the transistor, it may be self-aligned to them nonetheless. Because the new gate structure is formed after the high-temperature source and drain formation as well as after all high-temperature growth and/or anneal cycles, it may be formed from a low-temperature material such as aluminum or copper. Copper gate conductors may be particularly advantageous because of the low resistance of copper, and because such gate conductors may be easily integrable with low-resistance copper interconnect technologies.

If part of a polysilicon gate conductor is removed as described above, a dual-gate memory cell having a dielectrically-spaced polysilicon lower gate and a metal upper gate may be fabricated by placing a dielectric layer on the remaining polysilicon and forming a metal layer over the dielectric layer. Using copper for the metal gate may be particularly advantageous, in that copper has a very high electron storage capacity as compared to polysilicon and other metals. In many programmable, non-volatile memory configurations, the lower gate serves as a floating gate, and the upper gate as a control gate. The improved electron storage capacity of metals such as copper may be best exploited by having a metal floating gate, since the floating gate is typically the gate on which the "program" charge is stored. A device with a metal lower gate may be formed by removing all of the polysilicon gate conductor, and subsequently depositing a metal layer into the resulting trench. A dielectric layer is then deposited, followed by either a polysilicon or a second metal layer. Portions of the deposited layers which are external to the trench are subsequently removed. Such a memory cell may be able to have a reduced area and retain an optimal program charge, comparable to that of a larger conventional, non-copper floating gate device.

Because the process recited herein begins with fabrication of transistors by a standard process, devices including the new gate conductor design may be readily integrated with standard polysilicon-gate transistors. For example, memory cells may be integrated with transistors formed using a standard process flow. Furthermore, the dielectric which separates the underlying gate conductor from the overlying gate conductor in the embodiment described above may have a variable thickness. If desired, the thickness is modified to achieve a certain performance level. Alternatively, the inter-gate dielectric can be omitted to achieve direct coupling between the previously formed polysilicon and metal, or to achieve a unibody, contiguous metal gate structure. Furthermore, transistors having a variety of gate conductor materials may be combined in a single circuit. In this way, gate conductors with a variety of work functions may be used, creating, for example, transistors with a variety of threshold voltages. This variety of available threshold voltages may provide additional flexibility in circuit design. For example, a core region of an integrated circuit may contain lower threshold transistors compared to the input-output region of the circuit.

In addition to the process described above, a semiconductor device having a self-aligned metal-containing gate is contemplated herein. A gate structure, which includes a gate region and may include sidewall spacers, is arranged above an active region of a semiconductor substrate. A gate dielectric is interposed between the gate region and the active region, and a dielectric region is arranged above the active region and adjacent to lateral surfaces of the gate structure. The gate region may include a metal layer, a polysilicon layer, and/or a dielectric layer. Embodiments of this device include a transistor having a self-aligned metal gate, and a dual-gate memory cell having metal upper and/or lower gates.

An integrated circuit combining devices having differing gate compositions is also contemplated. A first gate structure is arranged above a first active region of a semiconductor substrate, and a second gate structure is arranged above a second active region, wherein the first and second active regions are separated by an isolation structure. The first and second gate structures include first and second gate regions, respectively, and may include sidewall spacers. First and second gate dielectrics are arranged on the first and second active regions below the first and second gate regions, respectively. The first and second gate regions may include metal layers, polysilicon layers, and/or dielectric layers. Embodiments of this integrated circuit include a circuit combining memory cells with conventional polysilicon-gate transistors, and/or a circuit combining transistors having a variety of gate conductor work functions, so that a variety of turn-on characteristics can be achieved on a single, monolithic substrate.

BRIEF DESCRIPTION OF THE DRAWINGS

Other objects and advantages of the invention will become apparent upon reading the following detailed description and upon reference to the accompanying drawings in which.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed. On the contrary, the intention is to cover all modifications, equivalents, and alternatives falling within the spirit and scope of the present invention.

DETAILED DESCRIPTION OF THE PREFERRED EMBODIMENTS

Figure 1:
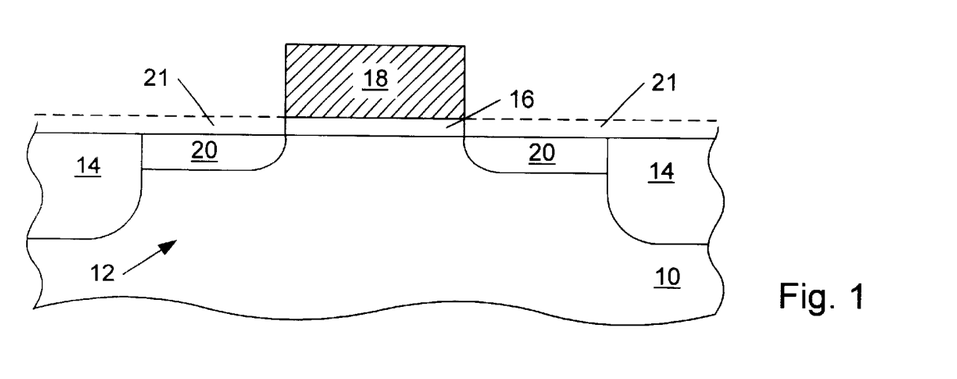
FIG. 1 is a partial cross-sectional view of a semiconductor topography including an active region within a semiconductor substrate upon which a transistor is formed, wherein the transistor includes a gate dielectric, a silicon gate structure, and source and drain impurity distributions.

Turning to the drawings, FIG. 1 illustrates a partial cross-section of a transistor 11 formed in an active region 12 of a semiconductor substrate 10, according to an embodiment of the process recited herein. Active region 12 is separated from adjacent active regions by isolation regions 14. A gate dielectric 16 and a gate structure including gate conductor 18 are formed above the active region, and source and drain impurity distributions 20 may be introduced and electrically activated (annealed) within substrate 10, self-aligned to gate conductor 18. In this case, gate dielectric portions 21 (shown by dashed lines) not covered by gate conductor 18 have been removed. Alternatively, portions 21 may be left in place for subsequent processing steps, as long as they are removed before making contact to the source and drain regions.

Semiconductor substrate 10 is preferably monocrystalline silicon, and is doped either n-type or p-type. Isolation regions 14 may be formed by methods well known in the art. One such method is the formation of trenches which are subsequently filled with a deposited dielectric, while another method which may be used is local oxidation of the substrate, using silicon nitride to mask the active regions. Gate dielectric 16 is preferably grown by heating substrate 10 to a temperature of greater than about 700° C. in either an oxidizing ambient to grow silicon dioxide or a nitrogen-containing ambient to grow silicon nitride. Silicon nitride is preferred for applications in which a diffusion barrier may be needed, such as the copper gate formation described below. In other cases, silicon dioxide is generally preferred because it is believed to form a superior interface with a silicon substrate. Other gate dielectrics may be used, including deposited silicon dioxide and silicon nitride, as well as nitrided silicon dioxide and silicon oxynitride. Gate conductor 18 is preferably a polysilicon gate conductor or any conductive (or to be rendered conductive) material capable of withstanding high temperature cycles. A polysilicon gate is patterned from a polysilicon layer which is deposited using chemical vapor deposition (CVD) of silicon from, for example, a silane source. Such a CVD process may alternatively result in an amorphous silicon layer, particularly if low substrate temperatures are used. An amorphous silicon layer may be patterned to form gate conductor 18, and other materials which can withstand subsequent processing (such as that needed to form source and drain regions) may also be used. Impurity distributions 20 are preferably introduced using ion implantation, and are of opposite type to that of substrate 10. For an n-channel transistor, for example, substrate 10 is p-type and distributions 20 are n-type. Typical n-type dopants include arsenic and phosphorus, while boron is a typical p-type dopant. If source and drain impurity distributions 20 are introduced by ion implantation, a subsequent anneal is performed in order to activate the impurities and repair damage to substrate 10.

Figure 2:
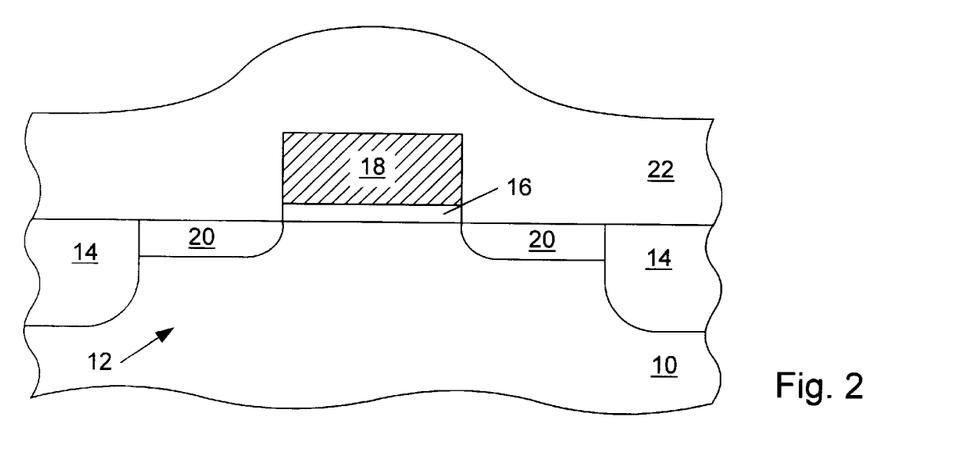
FIG. 2 is a partial cross-sectional view of the semiconductor topography wherein a dielectric layer is deposited over the transistor, subsequent to the transistor formation of FIG. 1.

Dielectric layer 22 is subsequently deposited over transistor 11, as shown in FIG. 2. Dielectric layer 22 is typically silicon dioxide deposited by CVD. In particular, decomposition of tetraethyl orthosilicate (TEOS) may be performed in a low-pressure CVD (LPCVD) reactor at a substrate temperature in the range from about 400° C. to about 800° C. to produce a very conformal film. Other techniques which may be used to deposit silicon dioxide for dielectric layer 22 include atmospheric-pressure CVD (APCVD) and plasma-enhanced CVD (PECVD) using a silane source. Dielectric layer 22 may also be formed from a different dielectric, such as silicon nitride or silicon oxynitride.

Figure 3:
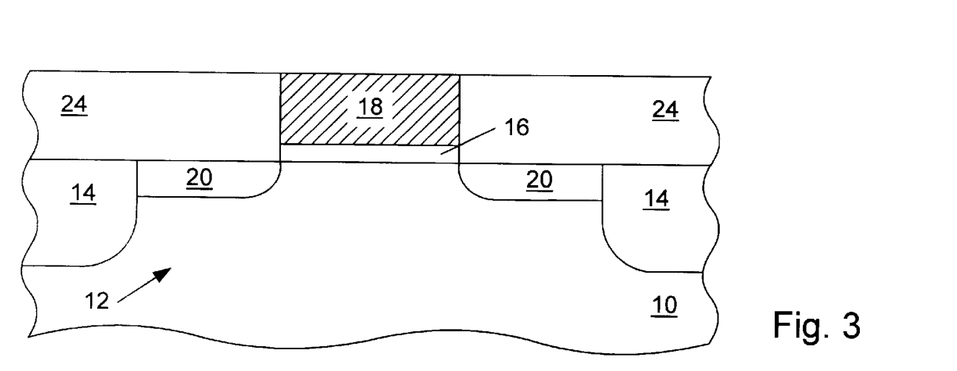
FIG. 3 is a partial cross-sectional view of the semiconductor topography wherein portions of the dielectric layer are removed such that dielectric regions having upper surfaces at the same level as the upper surface of the gate structure are formed, subsequent to the deposition of FIG. 2.
Figure 4:
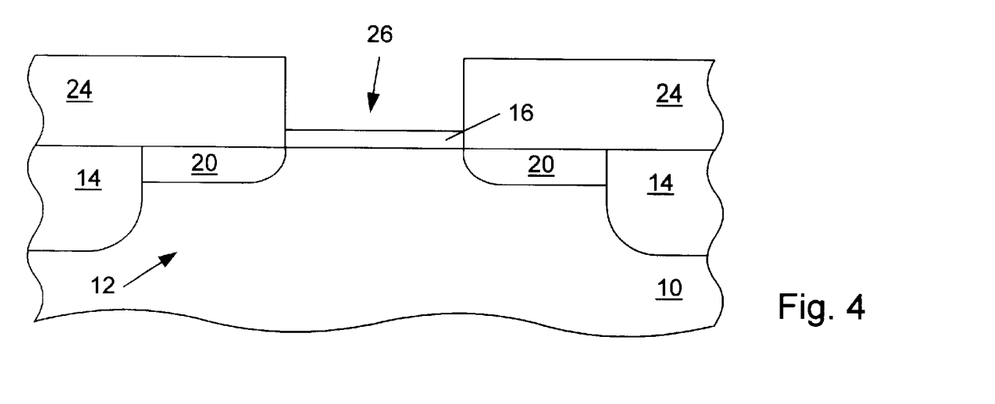
FIG. 4 is a partial cross-sectional view of the semiconductor topography wherein the silicon gate structure is removed such that a trench is formed, subsequent to the dielectric region formation of FIG. 3.

Portions of dielectric layer 22 which extend above the upper surface of gate conductor 18 are subsequently removed, as shown in FIG. 3. The removal process is preferably performed using chemical-mechanical polishing (CMP). The remaining portions of dielectric layer 22 form dielectric regions 24, which have upper surfaces at the same level as the upper surface of gate conductor 18. In this manner, all upper surfaces of transistor 11, except for the upper surface of gate conductor 18, are protected by dielectric regions 24. Gate conductor 18 may subsequently be removed, as shown in FIG. 4. This removal is preferably done using an etching process. In a preferred embodiment for which gate conductor 18 is polysilicon, gate conductor 18 is removed using an etch having a high selectivity for polysilicon over dielectrics, so that gate dielectric 16 and interlevel dielectric 24 are not removed. A suitable etch may be a chlorine-containing plasma etch process. Removal of gate conductor 18 forms trench 26 which is bounded by gate dielectric 16 and sidewalls of dielectric regions 24.

Figure 5:
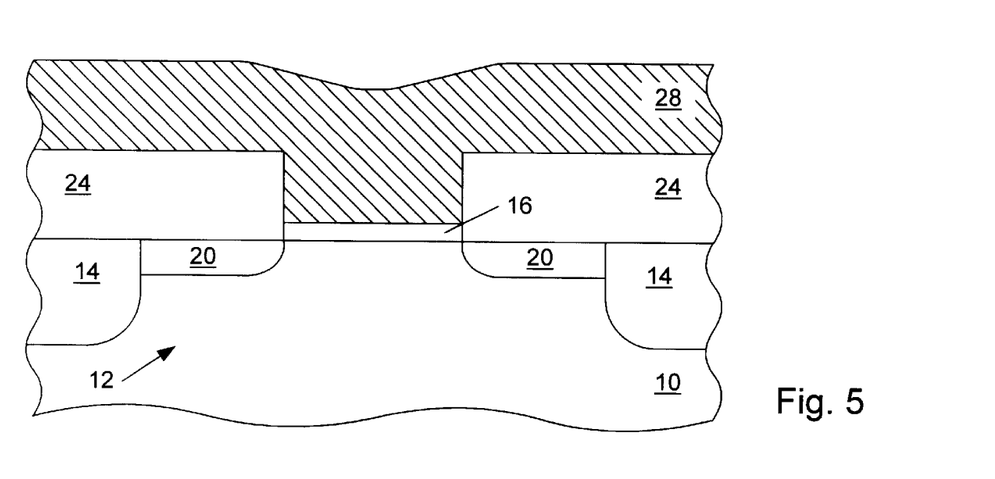
FIG. 5 is a partial cross-sectional view of the semiconductor topography wherein a metal layer is deposited filling the trench, subsequent to the gate structure removal of FIG. 4.

Turning now to FIG. 5, a metal layer 28 may be deposited over gate dielectric 16 and dielectric regions 24, such that trench 26 is filled. Metal layer 28 is preferably formed using a low-resistivity metal such as copper or aluminum, or a metal alloy which demonstrates high conductivity. Copper may be particularly advantageous because of its extremely low resistivity, and its compatibility with copper interconnect processes. Because source and drain impurity distributions 20 are formed prior to deposition of metal layer 28, metal layer 28 is believed not to undergo high temperatures during subsequent processing. It is therefore believed to be not necessary for metal layer 28 to be capable of withstanding high temperatures. In an embodiment for which metal layer 28 is formed from copper, gate dielectric 16 is preferably silicon nitride, because silicon nitride is believed to be more effective than silicon dioxide in blocking diffusion of copper atoms from their deposited positions. Deposition of copper for metal layer 28 may include deposition of an adhesion promoting layer and/or deposition of a diffusion barrier layer. Titanium nitride, for example, is a suitable material for both adhesion promotion and diffusion blocking. Titanium nitride may be deposited by methods including evaporation or sputtering of titanium in a nitrogen ambient, sputtering of titanium nitride, and thermal nitridation of sputtered titanium. Copper deposition may also include formation of a thin seed layer of copper by physical vapor deposition (PVD) techniques such as evaporation or sputtering, or by CVD. Deposition of thicker copper layers may include CVD, PVD and plating techniques.

Figure 6:
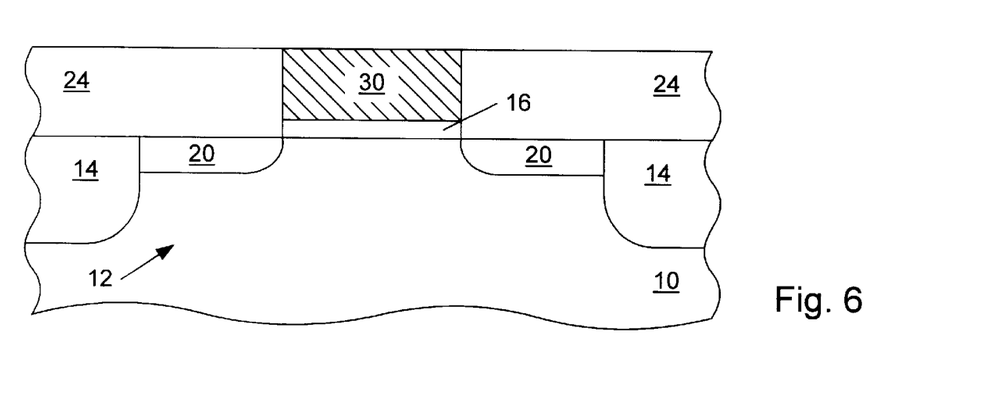
FIG. 6 is a partial cross-sectional view of the semiconductor topography wherein portions of the metal layer external to the trench are removed, subsequent to the deposition of FIG. 5.

Portions of metal layer 28 which extend above the upper surfaces of dielectric regions 24 are subsequently removed, as shown in FIG. 6. The removal is preferably done using CMP, and the remaining portion of metal layer 28 forms metal gate region 30. The resulting transistor may contain a low-resistance metal which is self-aligned to source and drain impurity distributions 20. Openings in dielectric regions 24 may subsequently be formed by conventional lithography and etching techniques so that contact may be made to the source and drain regions.

Figure 7:
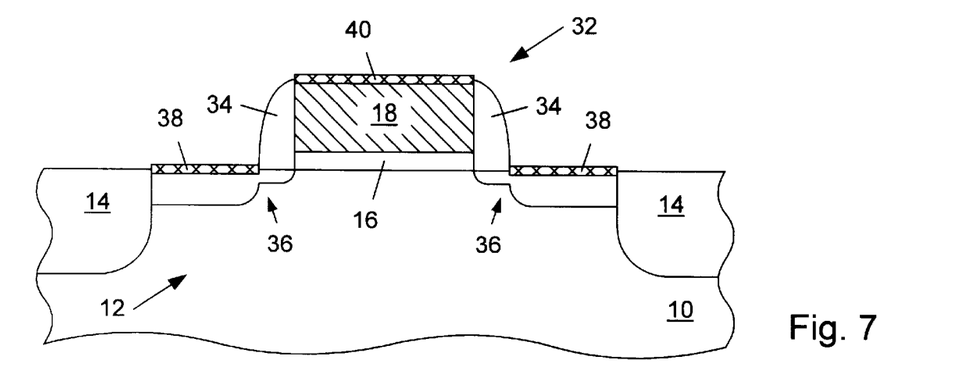
FIG. 7 is a partial cross-sectional view of a semiconductor topography according to an alternative embodiment, wherein a transistor is formed upon an active region of a semiconductor substrate, and wherein the transistor includes a gate structure having a silicon gate region and a pair of dielectric sidewall spacers, a gate dielectric, source and drain impurity distributions self-aligned both to the gate region and to the sidewall spacer, and silicide regions on upper surfaces of the source, drain and gate region.

Turning now to FIG. 7, a partial cross section of a transistor 32 formed in active region 12 according to an alternative embodiment is shown. Transistor 32 differs from transistor 11 shown in FIG. 1 in several respects. For example, dielectric spacers 34 are formed adjacent to gate conductor 18, to form a gate structure including gate conductor 18 and spacers 34. Instead of a single impurity introduction to form source and drain regions, as for transistor 11, source and drain regions 36 of transistor 32 may be formed using a lightly-doped impurity distribution self-aligned to gate conductor 18 and a heavily-doped impurity distribution self-aligned to lateral surfaces of spacers 34, as is well-known in the art. Following the formation of source and drain regions 36, a salicide process may be performed in a manner well-known in the art to form silicide regions 38 on upper surfaces of source and drain regions 36, and silicide region 40 on the upper surface of gate conductor 18. Formation of spacers 34 may be advantageous for reasons including the ability to form lightly-doped regions under the spacers which may lower the maximum electric field developed at the drain end of the channel. This lowered electric field may reduce the severity of hot-carrier effects such as avalanche breakdown at the drain/substrate junction and injection of carriers into the gate dielectric. Spacers 34 may also be advantageous by providing isolation between the source/drain and gate regions so that a salicide process may be performed. Spacers 34 are typically silicon dioxide, formed by CVD of a conformal silicon dioxide layer and anisotropic etching of the layer to form spacers. Spacers 34 may also be formed from other dielectrics such as silicon nitride or silicon oxynitride.

Figure 8:
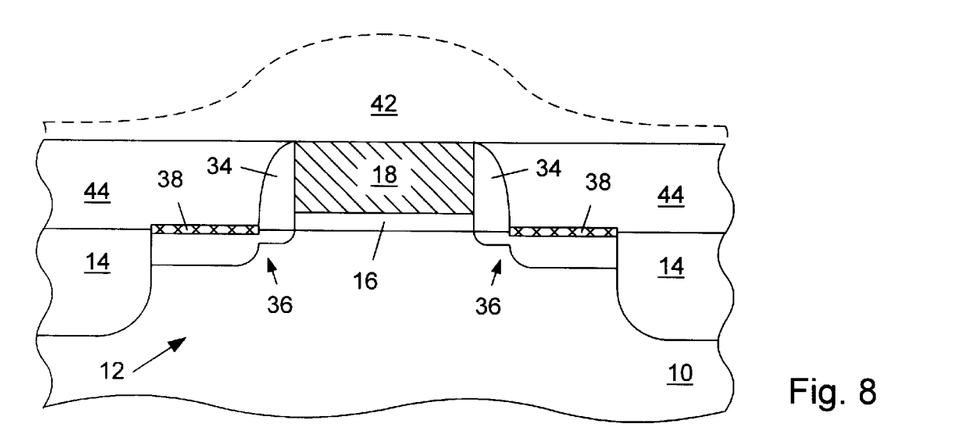
FIG. 8 is a partial cross-sectional view of the semiconductor topography wherein dielectric regions are formed having upper surfaces at the same level as the upper surface of the gate structure, subsequent to the transistor formation of FIG. 7.
Figure 9:
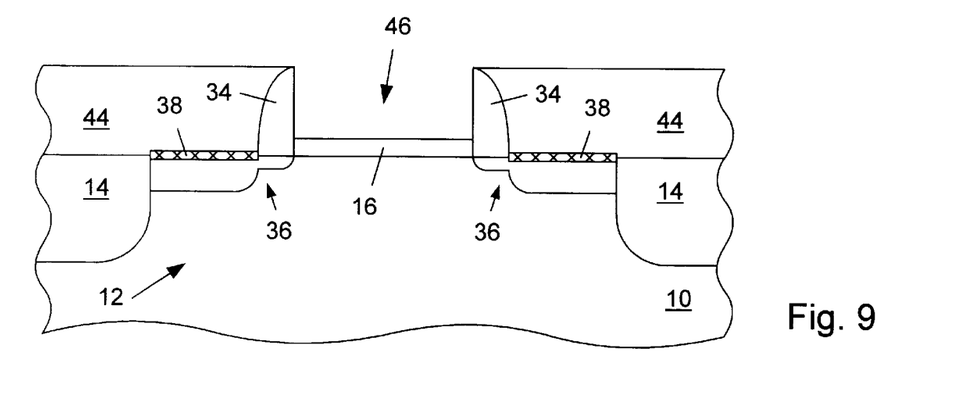
FIG. 9 is a partial cross-sectional view of the semiconductor topography wherein the silicon gate region is removed such that a trench is formed, subsequent to the dielectric region formation of FIG. 8.

Dielectric layer 42 is subsequently deposited over transistor 32, as shown in FIG. 8. The composition and formation of dielectric layer 42 are similar to those of dielectric layer 22 shown in FIG. 2. Portions of dielectric layer 42, as indicated by the dashed line in FIG. 8, are subsequently removed, preferably by CMP, to form dielectric regions 44. In the case shown, gate region silicide 40 is removed during the CMP process. Alternatively, a portion of the gate silicide may remain after formation of dielectric regions 44. Gate conductor 18 may subsequently be removed, preferably using a dry etch process, as shown in FIG. 9. In the event that a portion of silicide layer 40 remains over gate conductor 18, the etch process used must remove both silicide and polysilicon. The chosen etchant is selective to the gate conductor material so as to ensure the interlevel dielectric remains and that the ensuing trench is self-aligned to the sidewalls of the retained spacers. Thus, removal of gate conductor 18 forms trench 46, which is bounded by gate dielectric 16 and substantially vertical sidewalls of spacers 34.

Figure 10:
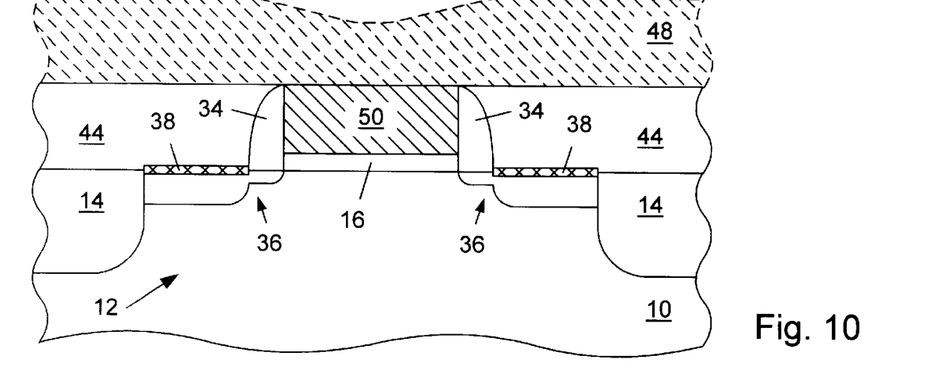
FIG. 10 is a partial cross-sectional view of the semiconductor topography wherein a metal layer is deposited and portions of the metal layer external to the trench are removed, subsequent to the gate region removal of FIG. 9.

A metal layer 48 may then be deposited over gate dielectric 16, spacers 34, and dielectric regions 44, such that trench 46 is filled, as shown in FIG. 10. The composition and formation of metal layer 48 are similar to those of metal layer 28 shown in FIG. 5. Portions of metal layer 48 which extend above the upper surfaces of dielectric regions 44, shown by dashed lines in FIG. 10, are subsequently removed such that metal gate region 50 is formed. The resulting transistor may contain a low-resistance metal gate which is self-aligned to source and drain regions 36. Source and drain regions 36 may contain lightly-doped regions under spacers 34 which may mitigate hot-carrier effects, and source and drain regions 36 may also include silicide contact regions 38. Openings in dielectric regions 44 may subsequently be formed by conventional lithography and etching techniques so that contact may be made to source and drain regions 36.

Figure 11:
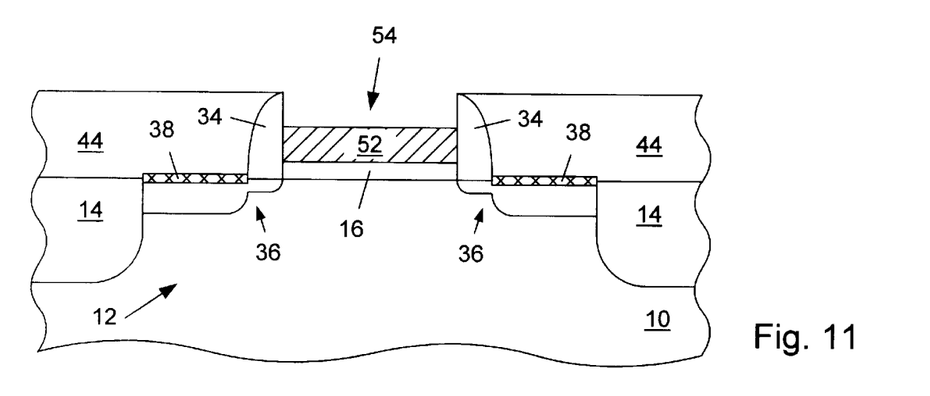
FIG. 11 is a partial cross-sectional view of the semiconductor topography according to an alternative embodiment to that of FIG. 9, wherein only a portion of the silicon gate region is removed to form a trench, subsequent to the dielectric region formation of FIG. 8.
Figure 12:
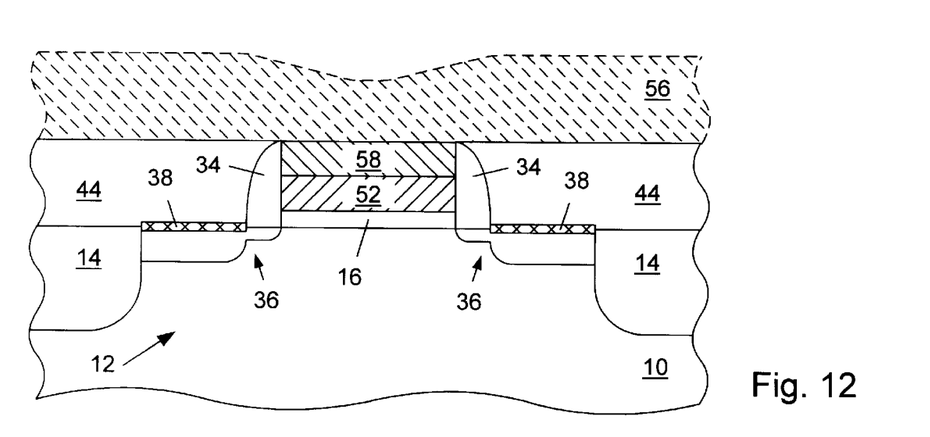
FIG. 12 is a partial cross-sectional view of the semiconductor topography wherein a metal layer is deposited and portions of the metal layer external to the trench are removed to form a metal region, subsequent to the partial gate region removal of FIG. 11.

Turning now to FIG. 11, an alternative embodiment is shown in which only a portion of gate conductor 18 is removed, subsequent to the dielectric region formation of FIG. 8. The removal is preferably done using an etch process similar to that shown in FIG. 4. Portion 52 of gate conductor 18 remains following the etch step, and trench 54 is formed, bounded by an upper surface of portion 52 and sidewalls of spacers 34. A metal layer 56 may subsequently be deposited over portion 52, spacers 34 and dielectric regions 44, such that trench 54 is filled, as shown in FIG. 12. Metal layer 56 is preferably similar to metal layer 28 shown in FIG. 5. Portions of metal layer 56 which extend above the upper surfaces of dielectric regions 44, shown by a dashed line in FIG. 12, are subsequently removed such that metal gate portion 58 is formed. The resulting transistor may contain a low-resistance metal upper gate region, which may be advantageous in making contact to the gate.

Figure 13:
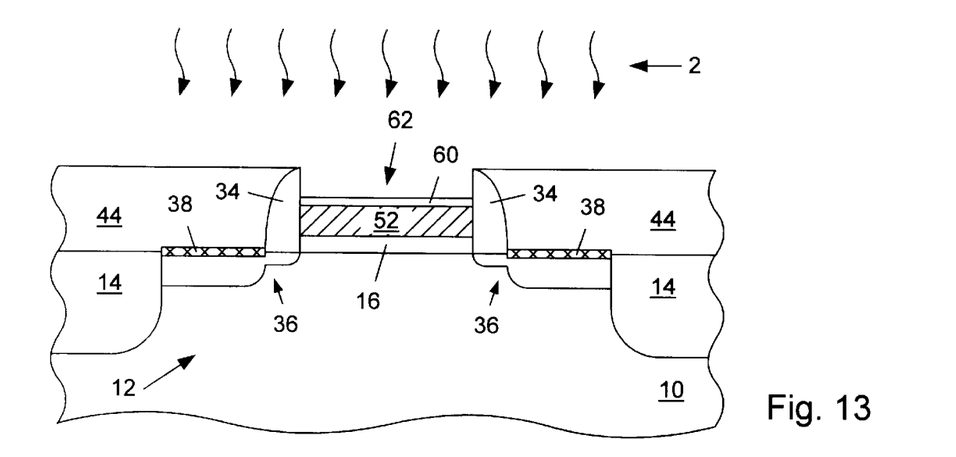
FIG. 13 is a partial cross-sectional view of the semiconductor topography according to an alternative embodiment, wherein a thin dielectric layer is grown on a remaining portion of the silicon gate region, subsequent to the partial gate region removal of FIG. 11.

In an alternative embodiment shown in FIG. 13, a thin dielectric layer is grown after the partial gate conductor removal of FIG. 11. Gate conductor portion 52 is heated using thermal process 2 to form dielectric layer 60. Thermal process 2 preferably includes heating substrate 10 to a temperature of greater than about 700° C. in either an oxidizing ambient to grow silicon dioxide or a nitrogen-containing ambient to grow silicon nitride. Silicon nitride is preferred for applications in which a diffusion barrier may be needed, such as copper gate formation above a dielectric layer. In other cases, silicon dioxide is generally preferred because it is believed to form a superior interface with a silicon layer. Other dielectrics which may be used include nitrided silicon dioxide and silicon oxynitride. Trench 62, bounded by dielectric layer 60 and sidewalls of spacers 34, results from the growth of dielectric layer 60.

Figure 14:
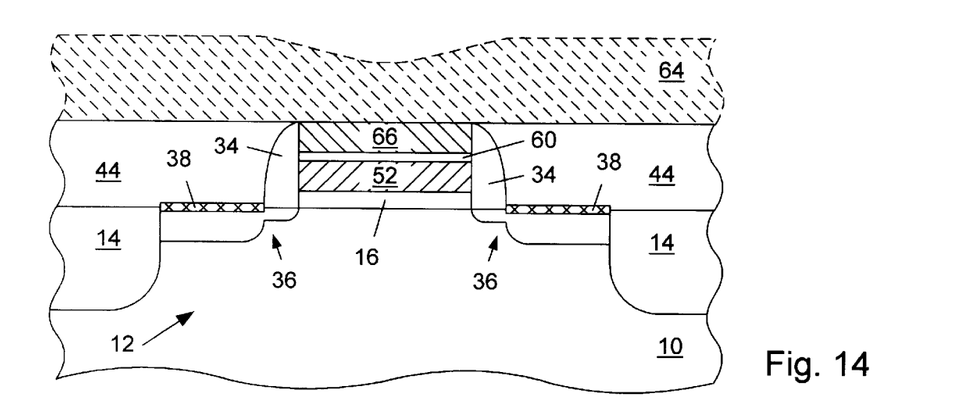
FIG. 14 is a partial cross-sectional view of the semiconductor topography wherein a metal layer is deposited above the thin dielectric layer and portions of the metal layer external to the trench are removed such that a metal region is formed within the trench, subsequent to the thin dielectric layer growth of FIG. 13.

A metal layer 64 may subsequently be deposited over dielectric layer 60, spacers 34 and dielectric regions 44, such that trench 62 is filled, as shown in FIG. 14. Metal layer 64 is preferably similar to metal layers 28, 48, and 56, shown in FIGS. 5, 10, and 12, respectively. Portions of metal layer 64 which extend above the upper surfaces of dielectric regions 44, shown by a dashed line in FIG. 14, are subsequently removed such that metal gate region 66 is formed. The resulting device is a dual gate structure, which may be useful, for example, as a memory cell. Gate conductor portion 52, for example, may serve as a floating gate, and metal gate region 66 may function as a control gate or select gate for a cell in a flash electrically-erasable programmable read-only memory (EEPROM) device. The use of copper for metal gate region 66 may be advantageous because of a higher electron storage capacity for copper as compared to polysilicon and to other metals. This may allow a memory cell using a copper gate to have a smaller area than a conventional memory cell which handles the same amount of charge. In an embodiment having metal gate region 66 formed from copper, it may be advantageous for dielectric layer 60 to be silicon nitride. Silicon nitride is believed to form a superior diffusion barrier to copper as compared to silicon dioxide. The use of copper to form metal gate region 66 may include the deposition of adhesion and/or diffusion barrier layers, and CVD, PVD and/or plating of copper, as described for metal layer 28 shown in FIG. 5.

It should be noted that all embodiments of the process, device and integrated circuit recited herein may be realized with or without dielectric spacers such as spacers 34. Although most embodiments described herein include spacers, each may be formed without spacers in a manner similar to that shown in FIGS. 1 through 6.

Figure 15:
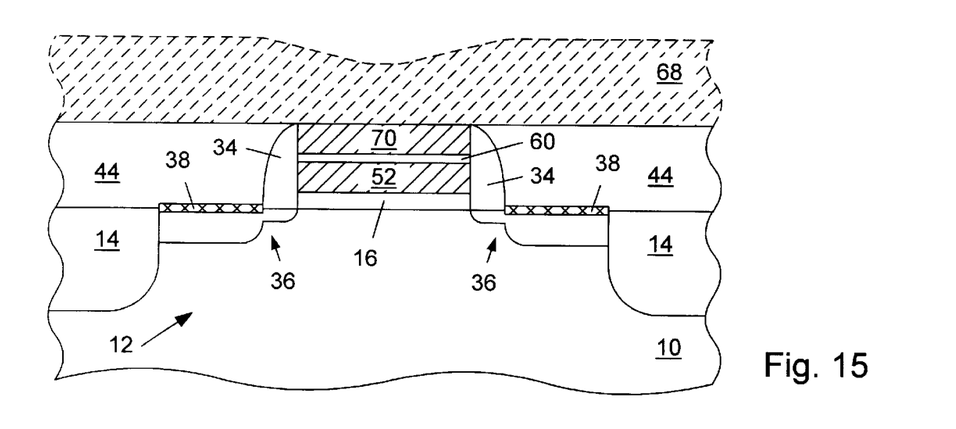
FIG. 15 is a partial cross-sectional view of the semiconductor topography according to an alternative embodiment, wherein a polysilicon layer is deposited above the thin dielectric layer and portions of the polysilicon layer external to the trench are removed, subsequent to the thin dielectric layer growth of FIG. 13.

In an alternative embodiment of the dual-gate structure shown in FIG. 14, a silicon upper gate region may be formed, as shown in FIG. 15. A polysilicon layer 68 may be deposited over dielectric layer 60, spacers 34 and dielectric regions 44, such that trench 62 is filled. Such a polysilicon layer is typically deposited by CVD using a silane source. Portions of polysilicon layer 68, shown by a dashed line in FIG. 15, which extend above the upper surfaces of dielectric regions 44 are subsequently removed, as shown in FIG. 15, such that polysilicon gate region 70 is formed. Such removal is typically performed using CMP. The resulting device is a dual-gate structure similar to that of FIG. 14, and may also be useful as a memory cell. The use of polysilicon gates may be desirable in some cases for integration with conventional polysilicon-gate transistor circuits.

Figure 16:
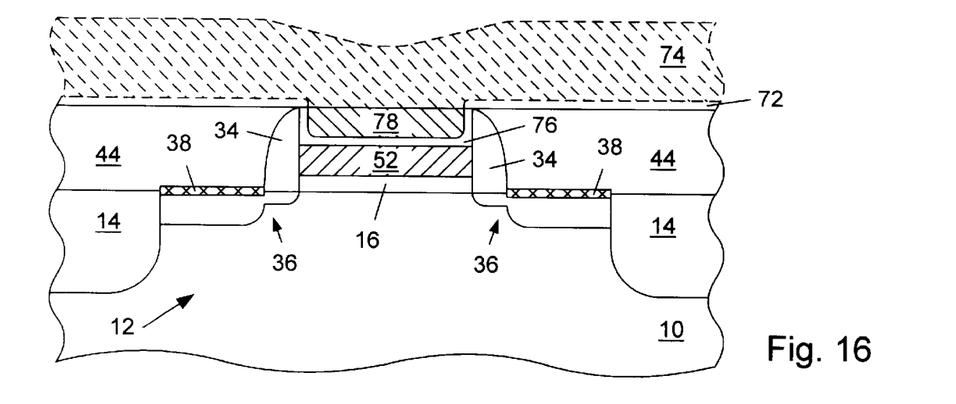
FIG. 16 is a partial cross-sectional view of the semiconductor topography according to an alternative embodiment, wherein a thin dielectric layer is deposited over the remaining portion of the silicon gate region and a metal region is formed over the thin dielectric layer, subsequent to the partial gate region removal of FIG. 11.

In an alternative embodiment shown in FIG. 16, a deposited dielectric may be formed instead of a grown dielectric over gate conductor portion 52. Dielectric layer 72 is deposited by CVD over gate conductor portion 52, spacers 34 and dielectric regions 44, subsequent to the partial gate conductor removal shown in FIG. 11. Metal layer 74 is subsequently deposited over dielectric layer 72. Portions of layers 72 and 74 external to trench 54, shown by dashed lines in FIG. 16, may subsequently be removed, leaving dielectric layer 76 and metal gate region 78. The removal is preferably done using CMP. Alternatively, portions of dielectric layer 72 external to trench 54 may be removed before deposition of metal layer 74. Because it is formed from a deposited layer, dielectric layer 76 extends up along the sidewalls of spacers 34, rather than being confined to an upper surface of gate conductor portion 52. The resulting device is a dual-gate structure which may be usable as a memory cell in a similar manner to the device shown in FIG. 14.

Figure 17:
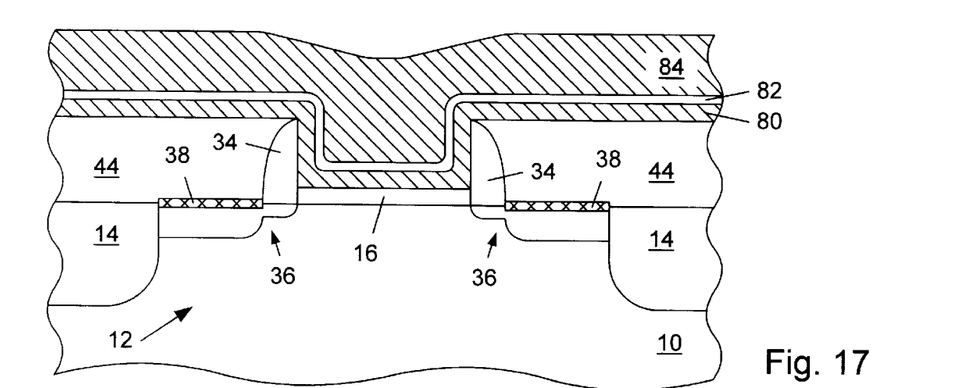
FIG. 17 is a partial cross-sectional view of the semiconductor topography according to an alternative embodiment, wherein a metal layer, a thin dielectric layer, and a second metal layer are deposited within the trench, subsequent to the silicon gate region removal of FIG. 9.
Figure 18:
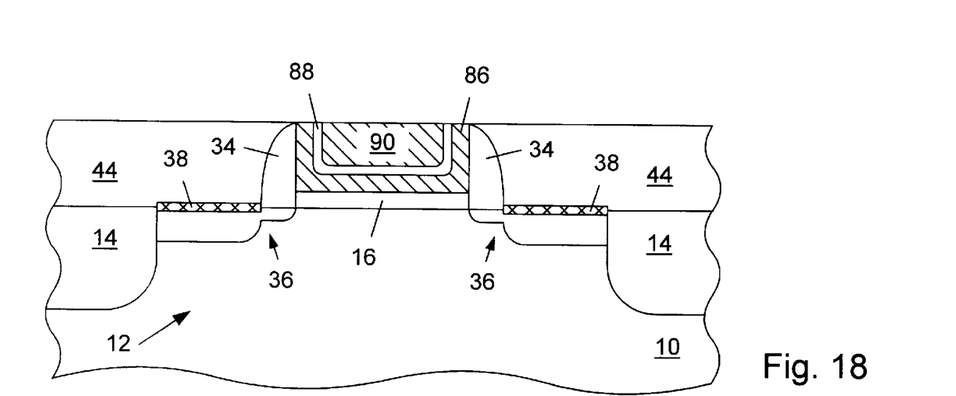
FIG. 18 is a partial cross-sectional view of the semiconductor topography wherein portions of the metal layers and thin dielectric layer external to the trench are removed, subsequent to the layer depositions of FIG. 17.

Turning now to FIG. 17, an alternative embodiment is shown in which a metal layer 80, a dielectric layer 82, and a second metal layer 84 are deposited over dielectric layer 16, spacers 34, and dielectric regions 44, subsequent to the gate conductor removal shown in FIG. 9. Portions of layers 80, 82 and 84 external to trench 46 are subsequently removed, preferably by CMP, as shown in FIG. 18. Alternatively, portions of each layer external to the trench may be removed separately, before deposition of any overlying layer, although this would require more processing steps. The resulting device, shown in FIG. 18, is a dual-gate structure having a lower metal gate 86, a dielectric layer 88, and an upper metal gate 90. Forming a memory structure having both gates made of metal may be advantageous because the metal gates may have a higher electron storage capacity than do polysilicon gates. In particular, this configuration may allow a metal floating gate to be achieved more readily. A metal floating gate is believed to be advantageous because of the enhanced charge retention of metal as compared to polysilicon. Copper may be particularly advantageous as a floating gate material, and may be deposited in a similar manner as described for metal layer 28 shown in FIG. 5. In the event of copper gate formation, it is believed to be advantageous for the underlying dielectric to be formed from silicon nitride, as discussed in other embodiments above. In an alternative embodiment, a polysilicon layer could be deposited in place of second metal layer 84, so that a metal lower gate and polysilicon upper gate are formed.

Figure 19:
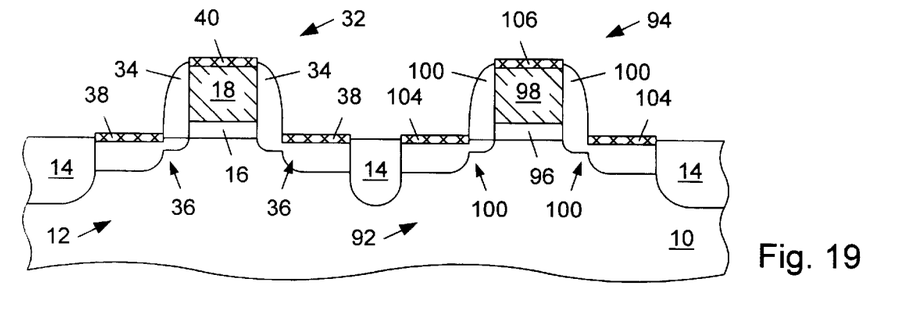
FIG. 19 is a partial cross-sectional view of a semiconductor topography according to an alternative embodiment, wherein a transistor is formed on each of two active regions of a semiconductor substrate, wherein the active regions are separated by isolation regions, and wherein each transistor includes a gate structure having a silicon gate region and a pair of dielectric sidewall spacers, a gate dielectric, source and drain impurity distributions self-aligned both to the gate region and to the sidewall spacer, and silicide regions on upper surfaces of the source, drain and gate region.
Figure 20:
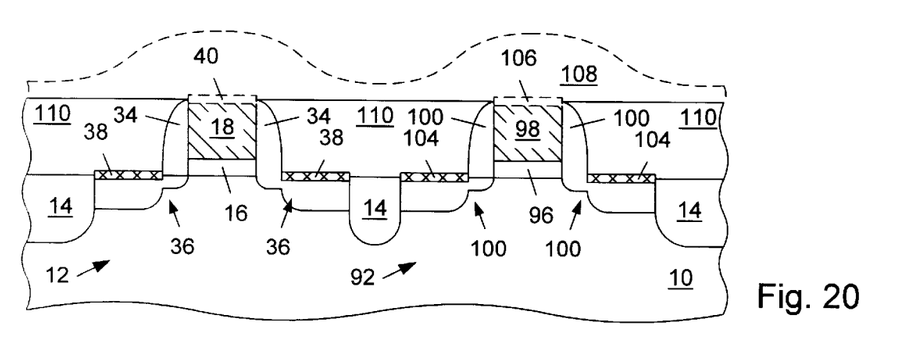
FIG. 20 is a partial cross-sectional view of the semiconductor topography wherein dielectric regions are formed adjacent to each gate structure, such that the dielectric regions have upper surfaces at the same level as the upper surfaces of the gate structures, subsequent to the transistor formation of FIG. 19.

Turning now to FIG. 19, an alternative embodiment is shown in which a second transistor 94 is formed on a second active region 92 of semiconductor substrate 10. Transistor 94 is preferably formed simultaneously with transistor 32, and as such includes a gate dielectric 96, a gate structure including gate conductor 98 and dielectric spacers 100, source and drain regions 102, source and drain silicide regions 104, and gate conductor silicide region 106. Dielectric regions 110 are formed adjacent to exposed lateral surfaces of spacers 34 and 100, as shown in FIG. 20. Dielectric layer 108 is deposited over both transistors, and portions of layer 108 which extend beyond the upper surfaces of gate conductors 18 and 98 (shown by dashed line in FIG. 20) are removed. The composition and formation of dielectric regions 110 are similar to those of dielectric regions 24 shown in FIG. 3. In the case shown, gate conductor silicide regions 40 and 106 are also removed. In this manner, all upper surfaces of transistors 32 and 94 are protected by dielectric except for upper surfaces of gate conductors 18 and 98.

Figure 21:
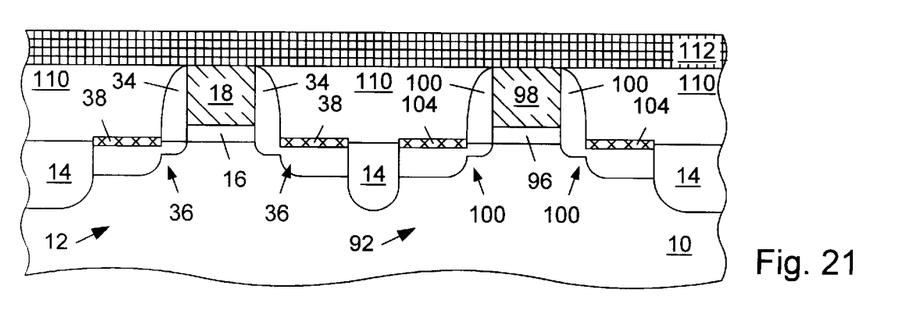
FIG. 21 is a partial cross-sectional view of the semiconductor topography wherein a layer of photoresist is deposited over the semiconductor topography, subsequent to the dielectric region formation of FIG. 20.
Figure 22:
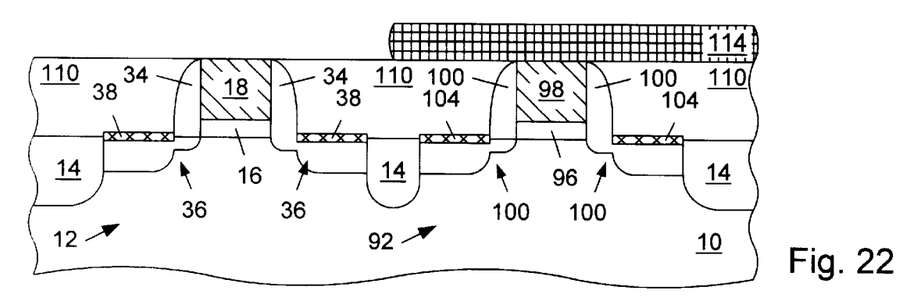
FIG. 22 is a partial cross-sectional view of the semiconductor topography wherein the photoresist layer is exposed and developed such that one of the gate conductors is masked by the remaining photoresist, subsequent to the photoresist deposition of FIG. 21.
Figure 23:
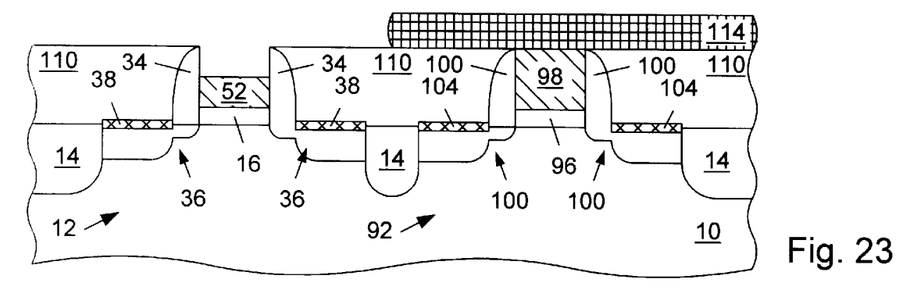
FIG. 23 is a partial cross-sectional view of the semiconductor topography wherein a portion of the exposed silicon gate region is removed to form a trench, subsequent to the photoresist mask formation of FIG. 22.

A photoresist layer 112 is subsequently deposited over gate conductors 18 and 98 and dielectric regions 110, as shown in FIG. 21. Photoresist layer 112 is exposed and developed using conventional techniques, so that mask layer 114 is formed covering gate conductor 98, as shown in FIG. 22. Mask layer 114 may be formed from other materials, such as dielectrics, although additional processing steps are needed to do this. Mask layer 114 is used to protect gate conductor 98 from a subsequent gate conductor removal etch, as discussed below. Because this etch is not believed to be a high-temperature process, a photoresist mask is believed to be effective as mask layer 114. Removal of a portion of gate conductor 18 to leave gate conductor portion 52 is shown in FIG. 23. The partial gate conductor removal is performed using an etch process, as shown in FIG. 11.

Figure 24:
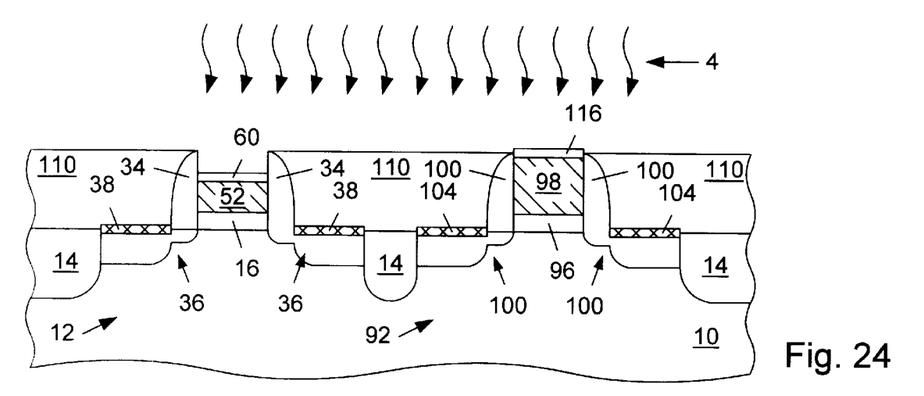
FIG. 24 is a partial cross-sectional view of the semiconductor topography wherein the photoresist mask is removed and a dielectric layer is grown, subsequent to the partial gate region removal of FIG. 23.

Turning now to FIG. 24, mask layer 114 is removed, and thermal process 4 is performed. Thermal process 4, like thermal process 2 shown in FIG. 13, includes heating substrate 10 to a temperature of greater than about 700° C. in either an oxidizing ambient to grow silicon dioxide or a nitrogen-containing ambient to grow silicon nitride. As a result of thermal process 4, dielectric layer 60 is formed on gate conductor portion 52, as is also shown in FIG. 13, and dielectric layer 116 is formed on gate conductor 98. Trench 62 is formed, bounded by dielectric layer 60 and sidewalls of spacers 34, as is also shown in FIG. 13.

Figure 25:
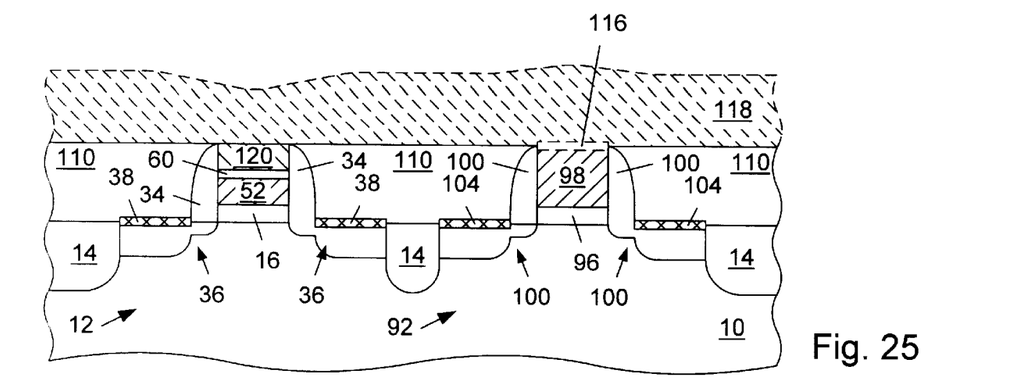
FIG. 25 is a partial cross-sectional view of the semiconductor topography wherein a metal layer is deposited over the semiconductor topography and portions external to the trench are removed, subsequent to the dielectric layer growth of FIG. 24.

Metal layer 118 may be subsequently deposited over dielectric layer 60, spacers 34, dielectric regions 110, and gate conductor 98 such that trench 62 is filled, as shown in FIG. 25. The composition and formation of metal layer 118 are similar to those of metal layer 28 shown in FIG. 5, for example. Portions of metal layer 118 external to trench 62, shown by dashed lines in FIG. 25, are subsequently removed, preferably by CMP, to form metal gate region 120. In the embodiment shown in FIG. 25, all of dielectric layer 116 is also removed by the CMP process. Alternatively, a portion of dielectric layer 116 may remain on gate conductor 98 after the removal process. This dielectric portion should be removed before a contact is formed to gate conductor 98. The embodiment shown in FIG. 25 includes a dual-gate device in active region 12, and a conventional transistor in active region 92. The dual-gate device may be useful for a memory cell, as noted in describing FIG. 14. The combination of the dual-gate device in active region 12 and the transistor in active region 92 may be used to form an integrated circuit which combines memory cells having low-resistance metal upper gates with conventional transistors. In an alternative embodiment, a dual-gate device having a polysilicon upper gate, as shown in FIG. 15, may be formed in active region 12 and combined with a conventional transistor in active region 92. In another alternative embodiment, a dual-gate device having a metal lower gate, as shown in FIG. 17, and a metal or polysilicon upper gate may be combined with a conventional transistor. With additional masking, gate conductor removal, and metal-containing gate formation, other embodiments may be formed which combine, for example, different configurations of memory cells having metal upper and/or lower gates.

Figure 26:
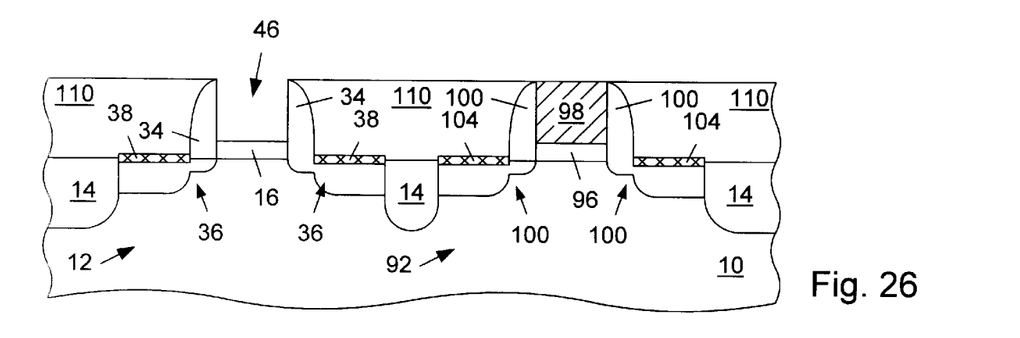
FIG. 26 is a partial cross-sectional view of the semiconductor topography according to an alternative embodiment, wherein all of the exposed silicon gate region is removed to form a trench and the photoresist mask is then removed, subsequent to the photoresist mask formation of FIG. 22.
Figure 27:
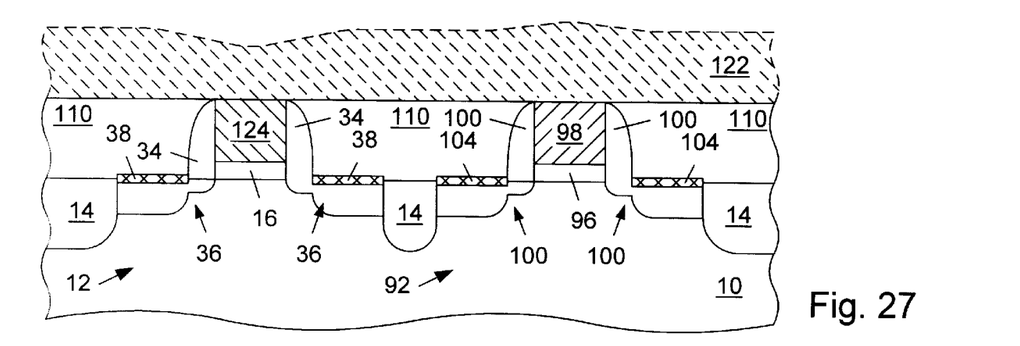
FIG. 27 is a partial cross-sectional view of the semiconductor topography wherein a metal layer is deposited over the semiconductor topography and portions external to the trench are removed to form a metal gate region, subsequent to the photoresist mask removal of FIG. 26.

In an alternative embodiment shown in FIG. 26, all of gate conductor 18 is removed and mask layer 114 is subsequently removed, subsequent to the formation of mask layer 114 shown in FIG. 22. Trench 46 is formed by removal of gate conductor 18, as is also shown in FIG. 9. Metal layer 122 may be subsequently deposited over gate dielectric 16, spacers 34, dielectric regions 110, and gate conductor 98 such that trench 46 is filled, as shown in FIG. 27. Portions of metal layer 122 external to trench 46, shown by a dashed line in FIG. 27, are subsequently removed to form metal gate region 124 above gate dielectric 16. The embodiment shown in FIG. 27 thus includes a metal-gate transistor in active region 12 and a conventional polysilicon-gate transistor in active region 92. The combination of these two transistors may be used to form an integrated circuit in which metal-gate transistors are combined with polysilicon-gate transistors. The metal-gate transistors may have different work functions than the polysilicon-gate transistors, and this may result in different threshold voltages for the metal-gate and polysilicon-gate transistors. The ability to combine transistors with different threshold voltages may provide additional flexibility to circuit designers. In an alternative embodiment, additional masking may be performed such that metal-gate devices formed by the process recited herein are protected from subsequent processing. Additional metal-gate devices may subsequently be formed from unmasked transistors, such that the additional metal-gate devices are formed from a different metal than previously-formed devices. In this way, metal gate devices formed from different metals may be formed on the same substrate. The different metals used in different devices may have different work functions, and this may result in different threshold voltages or operating voltages for devices formed from the different metals. This variation in threshold or operating voltage may provide additional flexibility to circuit designers. Additional masking, gate conductor removal and metal-containing gate formation may also be used to combine, for example, metal-gate transistors with memory cells.

It will be appreciated to those skilled in the art having the benefit of this disclosure that this invention is believed to provide a method for forming self-aligned metal-containing gate structures for semiconductor devices. As partially illustrated by the preceding embodiments, the process recited herein may allow extreme flexibility in tailoring the composition of self-aligned gate regions. After removal of all or a portion of a gate conductor, the removed material may be replaced with materials including metals, dielectrics, and/or semiconductors. In addition, devices having metal-containing gate structures formed using the process recited herein may be combined with conventional devices or with other devices having metal-containing gates. Further modifications and alternative embodiments of various aspects of the invention will be apparent to those skilled in the art in view of this description. It is intended that the following claims be interpreted to embrace all such modifications and changes and, accordingly, the specification and drawings are to be regarded in an illustrative rather than a restrictive sense.

What is claimed is:

1. A transistor, comprising a multi-layered gate conductor dielectrically spaced above a semiconductor substrate, wherein at least one layer of the multi-layered gate conductor comprises metal, and wherein the a layer of polycrystalline silicon is formed upon the metal layer.

2. The transistor as recited in claim 1, further comprising a pair of dielectric spacers configured adjacent opposed sidewall surfaces of the multi-layered gate conductor.

3. The transistor as recited in claim 1, wherein the multi-layered gate conductor comprises a layer of metal or polycrystalline silicon formed upon a dielectric comprising a material selected from the group consisting of silicon dioxide, silicon nitride, and silicon oxynitride.

4. The transistor as recited in claim 1, wherein the multi-layered conductor includes a dielectric comprising a material selected from the group consisting of silicon dioxide, silicon nitride, and silicon oxynitride formed upon a layer of polycrystalline silicon or metal.

5. The transistor as recited in claim 1, wherein the multi-layered conductor includes a layer of metal formed upon a layer of polycrystalline silicon or another layer of metal.

6. The transistor as recited in claim 1, wherein said metal comprises copper.

7. The transistor as recited in claim 1, wherein said multi-layered gate conductor is separated from said semiconductor substrate by a gate dielectric comprising silicon nitride.

8. The transistor as recited in claim 1, wherein said metal comprises aluminum.

9. A transistor, comprising:
   a pair of junctions within a semiconductor substrate separated from each other by a channel; and
   a metal-based gate conductor configured within a trench existing in lateral alignment directly above said channel.

10. The transistor as recited in claim 9, further comprising a dielectric existing above the pair of junctions and terminating as a sidewall of the trench.

11. The transistor as recited in claim 10, wherein an upper surface of the dielectric is coplanar with an upper surface of the metal-based gate conductor.

12. The transistor as recited in claim 10, wherein said dielectric includes a spacer, and wherein a substantially vertical surface of said spacer forms said sidewall of said trench.

13. The transistor as recited in claim 9, wherein the metal-based gate conductor comprises at least two layers, of which one layer comprises metal.

14. The transistor as recited in claim 9, wherein the metal-based gate conductor comprises a contiguous layer of metal or metal alloy.

15. An integrated circuit, comprising:
   a first active region of a semiconductor substrate separated from a second active region of said substrate by an isolation region;
   a first gate structure comprising a first gate region interposed between a pair of opposed first sidewall surfaces, arranged above said first active region;
   a second gate structure comprising a second gate region interposed between a pair of opposed second sidewall surfaces, arranged above said second active region, wherein an upper surface of said second gate structure is at a level commensurate with an upper surface of said first gate structure;
   a first gate dielectric arranged between said first active region and said first gate structure;
   a second gate dielectric arranged between said second active region and said second gate structure; and
   dielectric regions arranged above said first active region and said second active region, and adjacent to lateral surfaces of said first gate structure and said second gate structure, such that upper surfaces of said dielectric regions are at a level commensurate with said upper surface of said first gate structure, and wherein the dielectric regions substantially cover the upper surface of the semiconductor substrate.

16. The integrated circuit as recited in claim 15, wherein said first gate structure further comprises a pair of first dielectric spacers adjacent to said opposed first sidewall surfaces, and wherein said second gate structure further comprises a pair of second dielectric spacers adjacent to said opposed second sidewall surfaces.

17. The integrated circuit as recited in claim 15, wherein said first gate region comprises silicon.

18. The integrated circuit as recited in claim 17, wherein said second gate region comprises a metal region.

19. The integrated circuit as recited in claim 15, wherein said first gate region comprises a first metal layer.

20. The integrated circuit as recited in claim 19, wherein said second gate region comprises a second metal layer, and wherein a work function of said second metal layer is different than a work function of said first metal layer.

* * * * *